(12) United States Patent
Chen et al.

(10) Patent No.: US 10,043,912 B2
(45) Date of Patent: Aug. 7, 2018

(54) ARRAY SUBSTRATE AND THE MANUFACTURING METHODS THEREOF

(71) Applicant: Wuhan China Star Optoelectronics Technology Co., Ltd., Wuhan, Hubei (CN)

(72) Inventors: Gui Chen, Guangdong (CN); Qiang Gong, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 103 days.

(21) Appl. No.: 15/201,439

(22) Filed: Jul. 2, 2016

(65) Prior Publication Data

US 2017/0222059 A1 Aug. 3, 2017

(30) Foreign Application Priority Data

Jan. 29, 2016 (CN) .......................... 2016 1 00666134

(51) Int. Cl.
| | |
|---|---|
| *H01L 27/14* | (2006.01) |
| *H01L 29/786* | (2006.01) |
| *H01L 27/12* | (2006.01) |
| *G02F 1/1333* | (2006.01) |
| *G02F 1/1343* | (2006.01) |

(Continued)

(52) U.S. Cl.
CPC .... *H01L 29/78633* (2013.01); *G02F 1/13338* (2013.01); *G02F 1/134309* (2013.01); *G06F 3/044* (2013.01); *G06F 3/0412* (2013.01); *H01L 27/124* (2013.01); *H01L 27/1218* (2013.01); *H01L 27/1222* (2013.01); *H01L 27/1262* (2013.01); *H01L 29/78618* (2013.01); *H01L 29/78675* (2013.01); *G02F 2001/133302* (2013.01); *G02F 2201/123* (2013.01); *G02F 2202/104* (2013.01); *G06F 2203/04103* (2013.01)

(58) Field of Classification Search
None
See application file for complete search history.

(56) References Cited

U.S. PATENT DOCUMENTS

| | | |
|---|---|---|
| 2017/0045984 A1 | 2/2017 | Lu et al. |
| 2017/0059912 A1* | 3/2017 | Kim .................... G02F 1/13338 |

FOREIGN PATENT DOCUMENTS

| | | |
|---|---|---|
| CN | 105185742 A | 12/2015 |
| CN | 204945586 U | 1/2016 |

* cited by examiner

*Primary Examiner* — Cory Eskridge
(74) *Attorney, Agent, or Firm* — Andrew C. Cheng

(57) ABSTRACT

The present disclosure relates to an array substrate and the manufacturing method thereof. The array substrate includes a glass substrate. The shading metal layer and the buffering layer are formed on the glass substrate in sequence. The TFT layer is formed on the buffering layer, and the TFT is arranged above the shading metal layer. The insulation layer and the organic layer are formed on the TFT layer in sequence. In addition, the pixel electrode layer connects to the source/drain of the TFT via the first through hole. The touch electrode layer connects to the shading metal layer via the second through hole. The passivation layer is configured between the pixel electrode layer and the touch electrode layer. In this way, the manufacturing process is simplified, and the coupling capacitance between the touch electrode and the signal line may be effectively reduced.

8 Claims, 5 Drawing Sheets

(51) Int. Cl.
*G06F 3/041* (2006.01)
*G06F 3/044* (2006.01)

ARRAY SUBSTRATE AND THE MANUFACTURING METHODS THEREOF

BACKGROUND OF THE INVENTION

1. Field of the Invention

The present disclosure relates to liquid crystal display technology, and more particularly to an array substrate and the manufacturing method thereof.

2. Discussion of the Related Art

Conventional in-cell touch technology relates to dividing the common electrode (Com) within an active area (AA) to be small blocks, which operate as touch electrodes. Each of the touch electrodes connects to the Rx signal line of the touch chip (IC) to receive touch signals. Currently, Low Temperature Poly-silicon (LTPS) usually adopts the top gate of the thin film transistors (TFTs). To prevent the TFT within the AA area from leaking electricity, generally, a metallic layer is configured below the trench to block the light beams, that is, the so-called LSM layer.

The conventional InOcell design is shown in FIG. 1. A LSM layer 11 and a buffering layer 12 are formed on the glass substrate (not shown) in sequence. The polysilicon layer 132 is formed on the buffering layer 12. A doping process is applied to two lateral sides of the polysilicon layer 132 to form the doping area 132. Further, a heavy-doping area 133 is formed at one end of the polysilicon layer 132 facing away the polysilicon layer 132. A gate insulation layer 131 and a first metal layer 134 are formed on the polysilicon layer 132 in turn to form the gate. A first insulation layer 14 is formed on a second metal layer 135, and the second metal layer 135 is formed on the heavy-doping area 133 to form the source/drain (S/D). The second metal layer 135 passes through the first insulation layer 14. Further, an organic transparent layer 15 and a second insulation layer 141 are formed on the first insulation layer 14 in turn. A third metal layer 19 is formed on the second insulation layer 141 to operate as the Rx signal line. A third insulation layer 142, a touch electrode 16, a passivation layer 18, and a pixel electrode layer 17 are formed on the third metal layer 19 in turn. The pixel electrode layer 17 connects with the second metal layer 135 via a first through hole, and the touch electrode 16 connects with the third metal layer 19 via a second through hole.

It can be understood that a metal process has to be configured to form the Rx signal line during the manufacturing process of the array substrate. In addition, a through-hole process has to be configured in order to connect the Rx signal line and the touch electrode 16. The two manufacturing processes results in that the CMOS LTPS manufacturing process includes 14 masks. At the same time, in order to prevent the coupling capacitance (Cst) of the touch electrode and the Rx signal line from being too small, the thickness of the insulation layer between the third metal layer 19 and the touch electrode 16 cannot be too thin. Thus, the coupling capacitance between the touch electrode 16 and other Rx signal line cannot be too small.

SUMMARY

According to the present disclosure, the array substrate and the manufacturing method thereof may simply the manufacturing process, and may greatly reduce the coupling capacitance between the touch electrode and the signal line.

In one aspect, an array substrate includes: a glass substrate, and a shading metal layer and a buffering layer are formed on the glass substrate in sequence; a TFT layer configured on the buffering layer, the TFT layer includes a gate insulation layer and at least one TFT on the shading metal layer; an insulation layer and an organic transparent layer arranged on the TFT layer in sequence; a pixel electrode layer connecting to a source/drain of the TFT via a first through hole; a touch electrode layer connecting to the shading metal layer via a second through hole; and a passivation layer configured between the pixel electrode layer and the touch electrode layer.

Wherein the TFT includes a polysilicon layer, a first metal layer, and a second metal layer, the polysilicon layer is arranged on the buffering layer, two lateral sides of the polysilicon layer are configured with heavy-doping areas, the gate insulation layer and the first metal layer area arranged on the polysilicon layer in sequence, and a patterning process is applied to the first metal layer to form a gate, and the second metal layer passes through the insulation layer to deposit on the heavy-doping area to form the source/drain.

Wherein the first metal layer passes through the gate insulation layer and the buffering layer to connect with the shading metal layer.

Wherein the second metal layer passes through the gate insulation layer and the buffering layer to connect to the shading metal layer, and the touch electrode layer connects to the second metal layer via the second through hole.

Wherein the touch electrode layer is arranged on the organic transparent layer, and the passivation layer and the pixel electrode layer are arranged on the touch electrode layer in sequence, the first through hole passes through the passivation layer, the touch electrode layer and the organic transparent layer in sequence, and the second through hole passes through the organic transparent layer and the insulation layer in sequence.

Wherein the pixel electrode layer is arranged on the organic transparent layer, and the passivation layer and the touch electrode layer are arranged on the pixel electrode layer in sequence, the first through hole passes through the organic transparent layer, and the second through hole passes through the passivation layer, the organic transparent layer and the insulation layer in sequence.

In another aspect, a manufacturing method of array substrates includes: forming a shading metal layer and a buffering layer on the glass substrate in sequence; forming a TFT layer on the buffering layer, the TFT layer includes a gate insulation layer and at least one TFT, and wherein the TFT is arranged above the shading metal layer; forming an insulation layer and an organic transparent layer on the TFT in sequence; and connecting a pixel electrode layer and a source/drain of the TFT via a first through hole, and connecting the touch electrode layer and the shading metal layer via a second through hole.

Wherein the TFT includes a polysilicon layer, a first metal layer, and a second metal layer, the step of forming the TFT layer on the buffering layer further includes: forming a polysilicon layer on the buffering layer; heavy-doping two lateral sides of the polysilicon layer to form heavy-doping areas; forming a gate insulation layer and a first metal layer on the polysilicon layer in sequence to form a gate; and forming a second metal layer on the heavy-doping areas to form the source/drain.

Wherein the step of forming the second metal layer on the heavy-doping area further includes: the second metal layer passes through the gate insulation layer and the buffering layer to connect to the shading metal layer, and the touch electrode layer connects to the second metal layer via the second through hole.

Wherein the step of forming a gate insulation layer and a first metal layer on the polysilicon layer further includes: the first metal layer passes through the gate insulation layer and the buffering layer to connect to the shading metal layer.

In view of the above, the shading metal layer and the buffering layer are formed on the glass substrate in sequence. The TFT layer is formed on the buffering layer, and the TFT is arranged above the shading metal layer. The insulation layer and the organic layer are formed on the TFT layer in sequence. In addition, the pixel electrode layer connects to the source/drain of the TFT via the first through hole. The touch electrode layer connects to the shading metal layer via the second through hole. The passivation layer is configured between the pixel electrode layer and the touch electrode layer. In this way, the manufacturing process is simplified, and the coupling capacitance between the touch electrode and the signal line may be effectively reduced.

DETAILED DESCRIPTION OF THE EMBODIMENTS

Embodiments of the invention will now be described more fully hereinafter with reference to the accompanying drawings, in which embodiments of the invention are shown.

Figure 1:
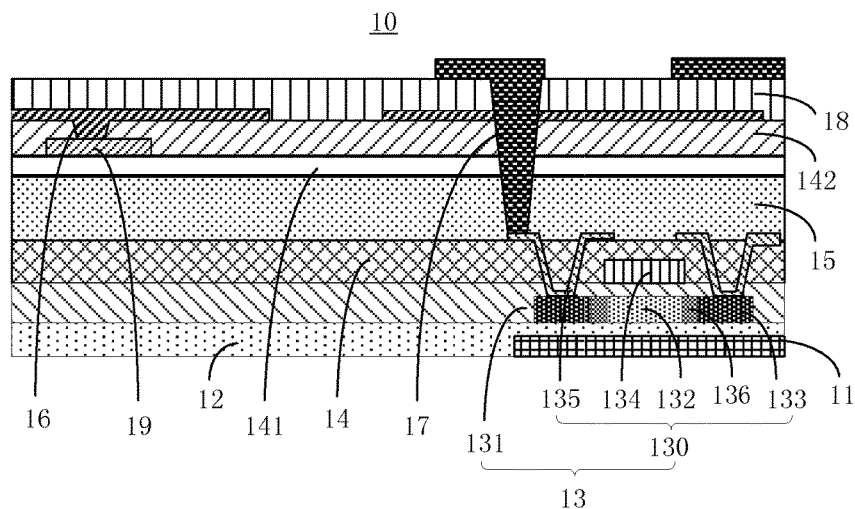
FIG. 1 is a schematic view of the conventional array substrate.
Figure 2:
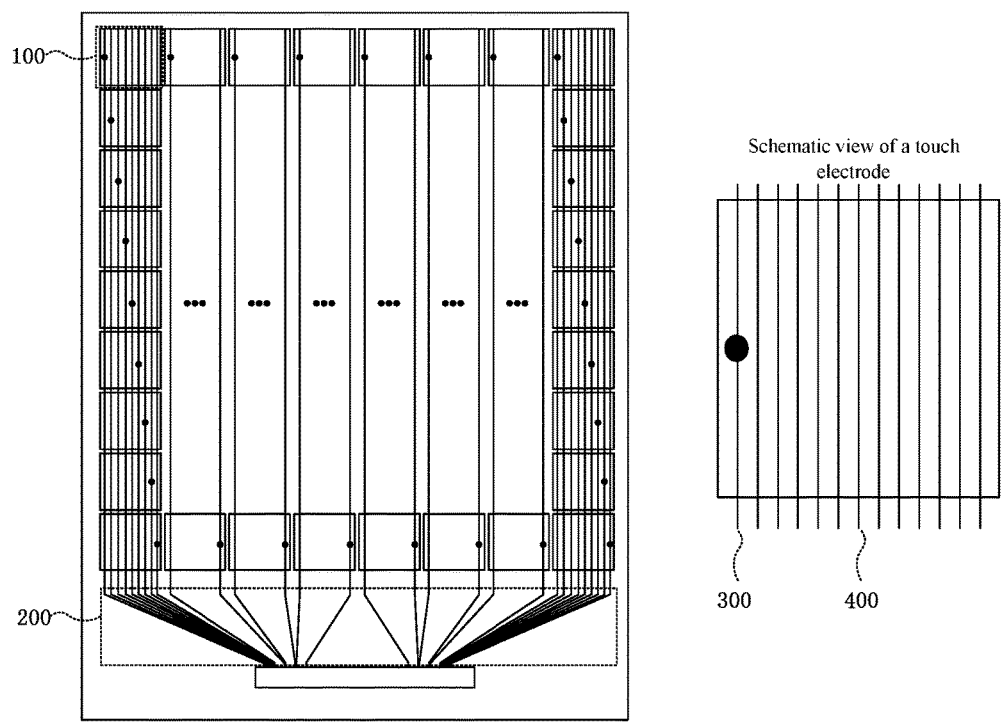
FIG. 2 is a schematic view showing the structure of the self-capacitance in-cell touch in accordance with one embodiment.

FIG. 2 is a schematic view showing the structure of the self-capacitance in-cell touch in accordance with one embodiment. The COM ITO within the AA area is divided into small blocks operating as the touch electrodes. The touch electrode connects to output pins of the touch chip (IC) by Rx signal line. As shown in FIG. 2, the reference numeral "100" relates to one touch electrode, the reference numeral "200" relates to wirings between the Rx signal line and the output pins of the touch chip (IC), the reference numeral "300" relates to Rx signal lines connected with the touch electrodes and the through holes between the touch electrodes, and the reference numeral "400" relates to the Rx signal lines connected with other touch electrodes, which may connect with the touch electrodes that are not short-connected.

Figure 3:
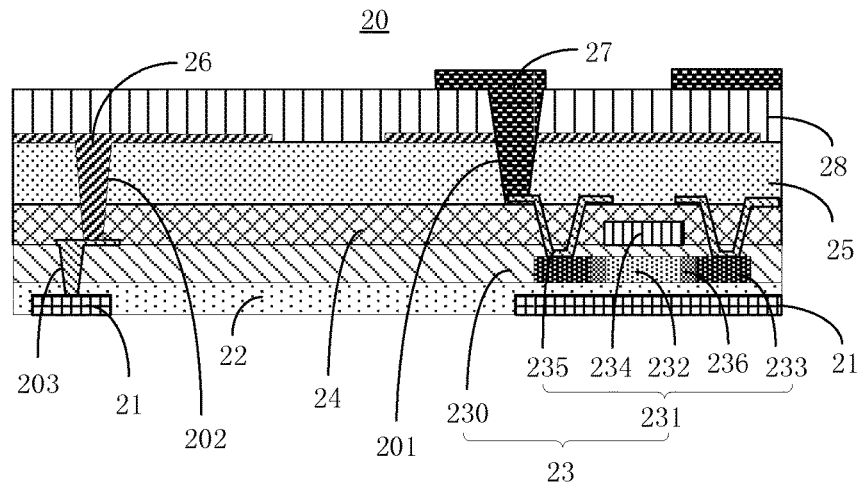
FIG. 3 is a schematic view of the array substrate in accordance with a first embodiment.

FIG. 3 is a schematic view of the array substrate in accordance with a first embodiment. As shown in FIG. 3, the array substrate 20 includes a glass substrate (not shown), a shading metal layer 21, a buffering layer 22, a TFT layer 23, an insulation layer 24, an organic transparent layer 25, a pixel electrode layer 27, a touch electrode layer 26, and a passivation layer 28. The shading metal layer 21 and the buffering layer 22 are arranged on the glass substrate in sequence. The TFT layer 23 is arranged on the buffering layer 22. The TFT layer 23 includes a gate insulation layer 230 and a TFT 231. The gate insulation layer 230 is arranged above the shading metal layer 21. The insulation layer 24 and the organic transparent layer 25 are arranged on the TFT layer 23 in sequence. The pixel electrode layer 27 connects with the source/drain of the gate insulation layer 230 via a first through hole. The touch electrode layer 26 connects with the shading metal layer 21 via a second through hole. The passivation layer 28 is arranged between the pixel electrode layer 27 and the touch electrode layer 26.

In one embodiment, the TFT 231 includes a polysilicon layer 232, a first metal layer 234, and a second metal layer 235. The polysilicon layer 232 is arranged on the buffering layer 22. Two heavy-doping areas 233 are arranged at two lateral sides of the polysilicon layer 232. Preferably, two doping areas 236 are arranged at two lateral sides of the polysilicon layer 232, and the heavy-doping area 233 is arranged at one side of the doping areas 236 facing away the polysilicon layer 232. The gate insulation layer 230 and the first metal layer 234 are arranged on the polysilicon layer 232 in sequence. A patterning process is applied to the first metal layer 234 to form a gate. The second metal layer 235 is arranged on the heavy-doping areas 233 to form the source/drain. Specifically, the second metal layer 235 passes through the insulation layer 24 and contacts with the heavy-doping areas 233 at two lateral sides of the polysilicon layer 232.

In the embodiment, as shown in FIG. 3, the touch electrode layer 26 is arranged on the organic transparent layer 25. The passivation layer 28 and the pixel electrode layer 27 are arranged on the touch electrode layer 26 in sequence. The first through hole passes through the passivation layer 28, the touch electrode layer 26, and the organic transparent layer 25. The conductive film forming the pixel electrode layer 27 passes through the passivation layer 28, the touch electrode layer 26, and the organic transparent layer 25, and contacts with the second metal layer 235 passing through the insulation layer 24 above the insulation layer 24. A second through hole 202 passes through the organic transparent layer 25, the insulation layer 24, the gate insulation layer 230, and the buffering layer 22. The conductive film forming the touch electrode layer 26 passes through the organic transparent layer 25, the insulation layer 24, the gate insulation layer 230 in sequence, and the buffering layer 22 contacts with the shading metal layer 21 directly. The second through hole 202 may pass through the organic transparent layer 25 and the insulation layer 24 in sequence. The second metal layer 235 connects with the shading metal layer 21 via a third through hole 203. The conductive film forming the touch electrode layer 26 passes through the organic transparent layer 25 and the insulation layer, and contacts with the second metal layer 235 above the gate insulation layer 230 so as to connect to the shading metal layer 21. The third through hole 203 passes through the gate insulation layer 230 and the buffering layer 22.

In the embodiment, the shading metal layer 21 connecting with the touch electrode layer 26 may connect to the shading metal layer 21 right below the TFT 231. At this moment, the shading metal layer 21 below the TFT 231 extends outward so as to connect with the touch electrode layer 26. The shading metal layer 21 connecting with the touch electrode layer 26 may be separated from the shading metal layer 21 right below the TFT 231. The shading metal layer 21 connecting with the touch electrode layer 26 operates as the Rx signal line. The shading metal layer 21 right below the TFT 231 is configured to shadow the light so as to prevent the TFT from the electrical leakage. The conductive film of the touch electrode layer 26 and of the pixel electrode layer 27 are ITO films.

In the embodiment, the through hole between the second metal layer 235 and the shading metal layer 21 may adopt a mask of the insulation layer 24. After the insulation layer 24 and the gate insulation layer 230 are etched, the buffering layer 22 having a greater etching selection ratio of SiNx to P—Si, such that other portions of the P—Si may not be etched when the second metal layer 235 and the shading metal layer 21 are connected.

The array substrate 20 adopts the shading metal layer 21 to operate as the Rx signal line connecting the touch electrode and the touch chip (IC). With such configuration, additional masking process for manufacturing the third metal layer is not needed. Thus, the through-hole process for connecting the touch electrode and the Rx signals is not needed. In brief, two masking processes may be omitted. In addition, by adopting the shading metal layer 21 to be the Rx signal line connecting the touch electrode and the touch chip (IC), a gap between the touch electrode layer 26 and the Rx signal line is larger. As shown in FIG. 3, the organic transparent layer 25, the insulation layer 24, the gate insulation layer 230, and the buffering layer 22 are arranged between the touch electrode layer 26 and the Rx signal line. Thus, the capacitance between the touch electrode and the Rx signal line may be configured to be very small, and thus the coupling capacitance between the touch electrode and the Rx signal line may be effectively reduced.

Figure 4:
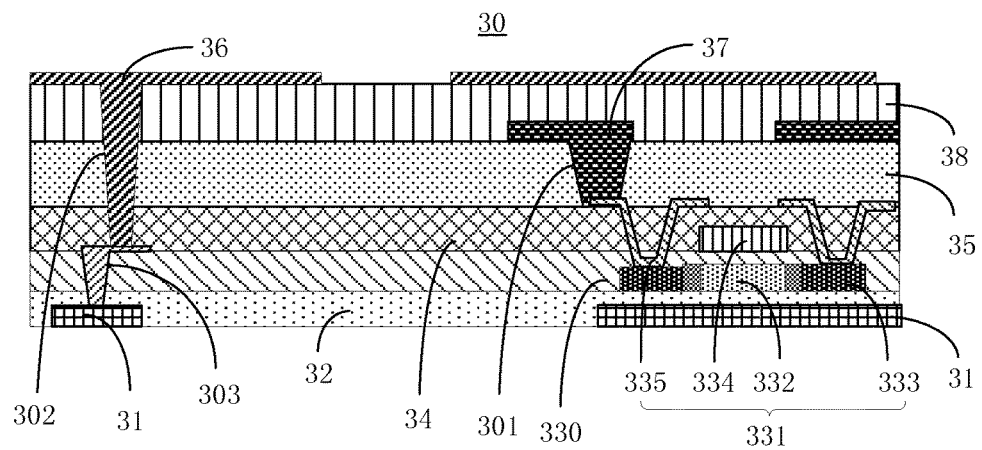
FIG. 4 is a schematic view of the array substrate in accordance with a second embodiment.

Referring to the array substrate 30 in FIG. 4, the TFT 331 includes a polysilicon layer 332, at least one heavy-doping area 333, a first metal layer 334, and a second metal layer 335. The structure of the TFT 331 is similar to that of the TFT 231, and thus detailed descriptions are omitted hereinafter. A pixel electrode layer 37 is arranged on an organic transparent layer 35. A passivation layer 38 and a touch electrode layer 36 are arranged on the pixel electrode layer 37 in sequence. As such, a first through hole 301 passes through the organic transparent layer 35. The conductive film forming the pixel electrode 37 passes through the organic transparent layer 35 and contacts with the second metal layer 335 above an insulation layer 34, and the second metal layer 335 passes through the insulation layer 34 the organic transparent layer, the insulation layer, the gate insulation layer and the buffering layer. A second through hole 302 passes through the passivation layer 38, the organic transparent layer 35, the insulation layer 34, the gate insulation layer 330, and the buffering layer 32. The conductive film forming the touch electrode passes through the passivation layer, the organic transparent layer, the insulation layer, the gate insulation layer, and the buffering layer in sequence to directly contact with the shading metal layer 31. The second through hole 302 may pass through the passivation layer 38, the organic transparent layer 35, and the insulation layer 34. The second metal layer 335 may pass through a third through hole 303 to connect to the shading metal layer 31. The conductive film forming the touch electrode layer 36 passes through the passivation layer 38, the organic transparent layer 35, and the insulation layer 34 to contact with the second metal layer 335 above the gate insulation layer 230, and further to connect to the shading metal layer 31. The third through hole 303 passes through the gate insulation layer 330 and the buffering layer 32 in sequence.

In the embodiment, the shading metal layer 31 connecting with the touch electrode layer 36 may connect to the shading metal layer 31 right below the TFT 331. At this moment, the shading metal layer 31 below the TFT 331 extends outward so as to connect with the touch electrode layer 36. The shading metal layer 31 connecting with the touch electrode layer 36 may be separated from the shading metal layer 31 right below the TFT 331. The shading metal layer 31 connecting with the touch electrode layer 36 operates as the Rx signal line. The shading metal layer 31 right below the TFT 331 is configured to shadow the light so as to prevent the TFT from the electrical leakage. The structures of other portions of the array substrate 30 are similar to those of the array substrate 20 in FIG. 3, and thus detailed descriptions are omitted hereinafter.

In the embodiment, the passivation layer 38, the organic transparent layer 35, the insulation layer 34, the gate insulation layer 330, and the buffering layer 32 are configured between the touch electrode layer 36 and the Rx signal line. With such configuration, the gap between the touch electrode layer 36 and the Rx signal line is increased. Thus, the capacitance between the touch electrode and the Rx signal line may be configured to be very small, and thus the coupling capacitance between the touch electrode and the Rx signal line may be effectively reduced.

Figure 5:
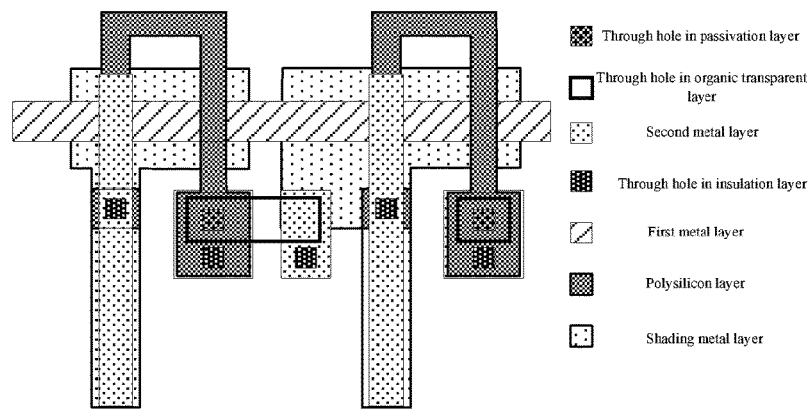
FIG. 5 is a schematic view showing the layout of the array substrate in accordance with the first embodiment.

FIG. 5 is a schematic view showing the layout of the array substrate in accordance with the first embodiment. As shown in FIG. 5, the shading metal layer operates as the Rx signal line. The second metal layer is connected with the shading metal layer by the through hole in the insulation layer. The conductive film forming the touch electrode and the second metal layer are connected via the through hole in the passivation layer and the through hole in the organic transparent layer. Thus, two masking process may be omitted by adopting general manufacturing process to connect the conductive film forming the touch electrode and the shading metal layer. At the same time, as the gap between the Rx signal line and the touch electrode is increased, the coupling capacitance between the touch electrode and the Rx signal line may be effectively reduced. Specifically, during the manufacturing process of the pixel electrode, the through hole between the shading metal layer and the conductive film forming the touch electrode may be formed by general manufacturing process.

Figure 6:
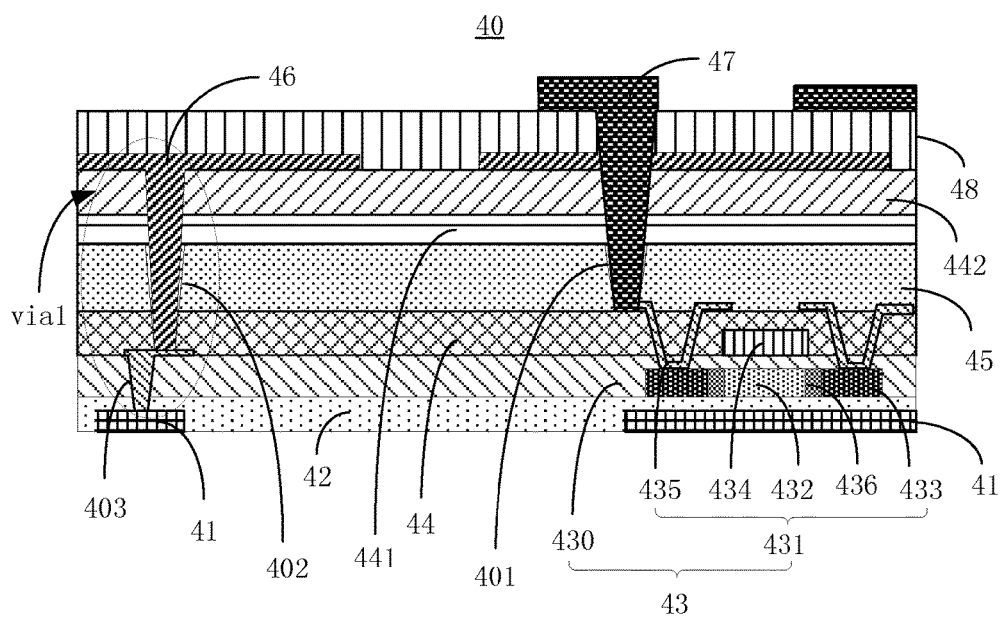
FIG. 6 is a schematic view of the array substrate in accordance with a third embodiment.

FIG. 6 is a schematic view of the array substrate in accordance with a third embodiment. The difference between the array substrate 40 and the array substrate 20 in FIG. 3 resides in that: the insulation layer 441 and the insulation layer 442 are arranged on the organic transparent layer 45 in sequence. The touch electrode layer 46 is arranged on the insulation layer 442, wherein "via1" relates to the through hole between the touch electrode layer 46 and the shading metal layer 41. The through hole (Via1) may include a second through hole 402 and a third through hole 403. The second through hole 402 passes through the insulation layer 441, the insulation layer 442, the organic transparent layer 45, and the insulation layer 44 in sequence. The third through hole 403 passes through the gate insulation layer 230 and the buffering layer 22 in sequence. The second metal layer 435 connects with the shading metal layer 41 via the third through hole 403. The conductive film forming the touch electrode layer 46 passes through the insulation layer 441, the insulation layer 442, the organic transparent layer 45, and the insulation layer 44 to contact with the second metal layer 435 above the gate insulation layer 430 so as to connect with the shading metal layer 41. The through hole (Via1) may include the second through hole 402, wherein the second through hole 402 passes through the insulation layer 441, the insulation layer 442, the organic transparent layer 45, the insulation layer 44, the gate insulation layer 430, and the buffering layer 42. The conductive film forming the touch electrode layer 46 passes through the insulation layer 441, the insulation layer 442, the organic transparent layer 45, the insulation layer 44, the gate insulation layer 430, and the buffering layer 42 in sequence to connect with the shading metal layer 41.

By configuring the insulation layer 441 and the insulation layer 442 between the organic transparent layer 45 and the touch electrode layer 46, the gap between the Rx signal line and the touch electrode is increased. Thus, the capacitance between the touch electrode and the Rx signal line may be configured to be very small, and thus the coupling capacitance between the touch electrode and the Rx signal line may be effectively reduced.

In the embodiment, the array substrate 40 may be configured with two insulation layers as the array substrate 30 in FIG. 4.

Figure 7:
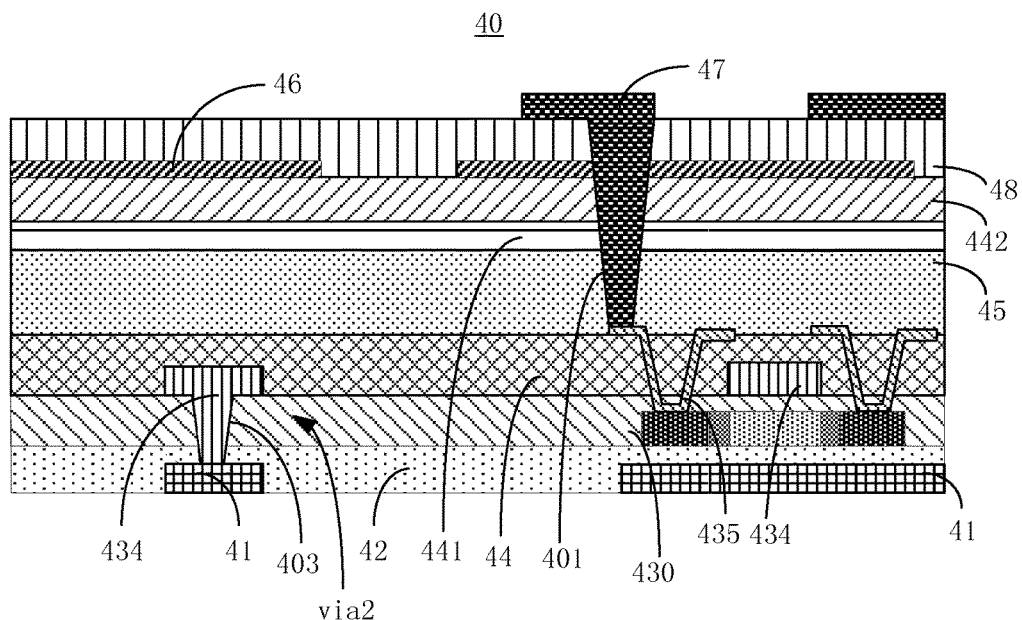
FIG. 7 is a schematic view of the array substrate in accordance with a fourth embodiment.

Referring to FIG. 7, a first metal layer 434 passes through a gate insulation layer 430 and a buffering layer 42 to connect with the shading metal layer 41. The through hole (via2) passes through the gate insulation layer 430 and the buffering layer 42. The shading metal layer 41 operates as the Rx signal line for connecting the touch electrode and the output pin of the touch chip (IC). The configuration of the first metal layer 434 connecting with the shading metal layer 41 may reduce the resistance of the Rx signal line. In the embodiment, on additional masking process may manufacture the through hole (via2). The deposition of the first metal layer 434 may be conducted at the same with the manufacturing of the gate, that is, no additional mask is needed.

Figure 8:
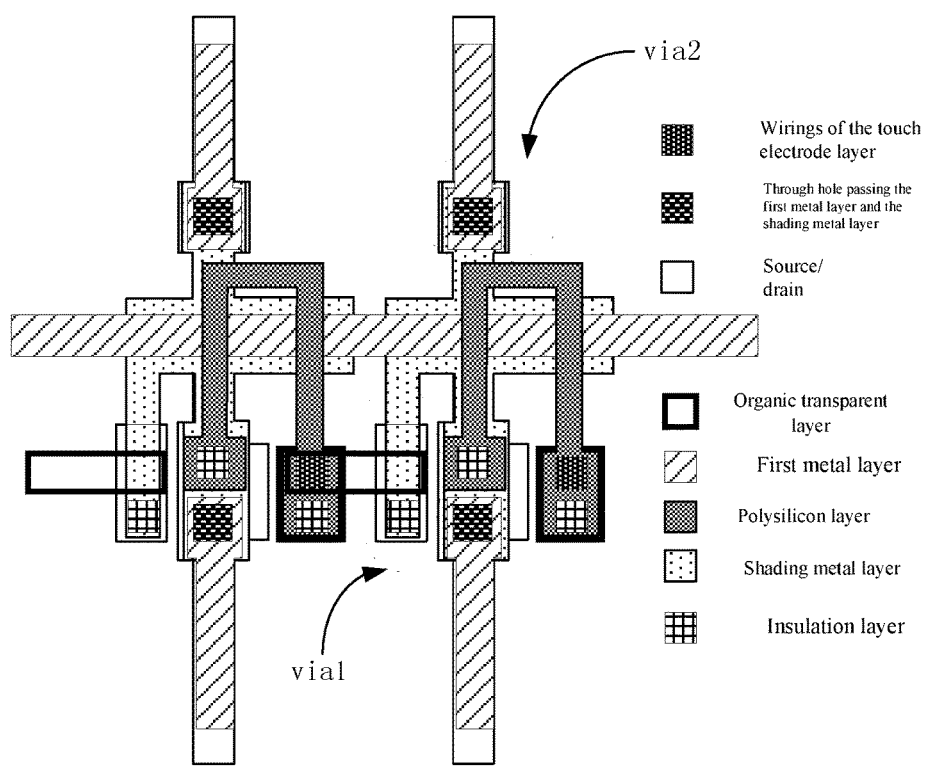
FIG. 8 is a schematic view showing the layout of the array substrate in accordance with the second embodiment.

The layout of the array substrate 40 is shown in FIG. 8. The shading metal layer operates as the Rx signal line. The touch electrode layer connects to the shading metal layer via the through hole (Via1). The first metal layer connects to the shading metal layer via the through hole (via2), wherein the structure of the through hole (Via1) may refer to the through hole (Via1) in FIG. 6. The structure of the through hole (via2) may refer to the through hole (via2) in FIG. 7.

The through hole (Via1) connects the conductive film of the touch electrode with the shading metal layer. The through hole (Via1) may be formed by general manufacturing process without additional mask. Thus, two masking processes may be omitted. At the same time, as the gap between the Rx signal line and he touch electrode is increased, the coupling capacitance between the touch electrode and the Rx signal line is reduced. Specifically, during the manufacturing process of the pixel electrode, the through hole between the shading metal layer and the conductive film of the touch electrode may be formed by general manufacturing process. The through hole (via2) may be formed by adding one additional masking process. The deposition of the first metal layer may be conducted at the same with the manufacturing of the gate, that is, no additional mask is needed. The first metal layer is deposited in through hole (via2) to reduce the resistance of the Rx signal line.

The above embodiments may be combined in any forms to form the array substrate.

Figure 9:
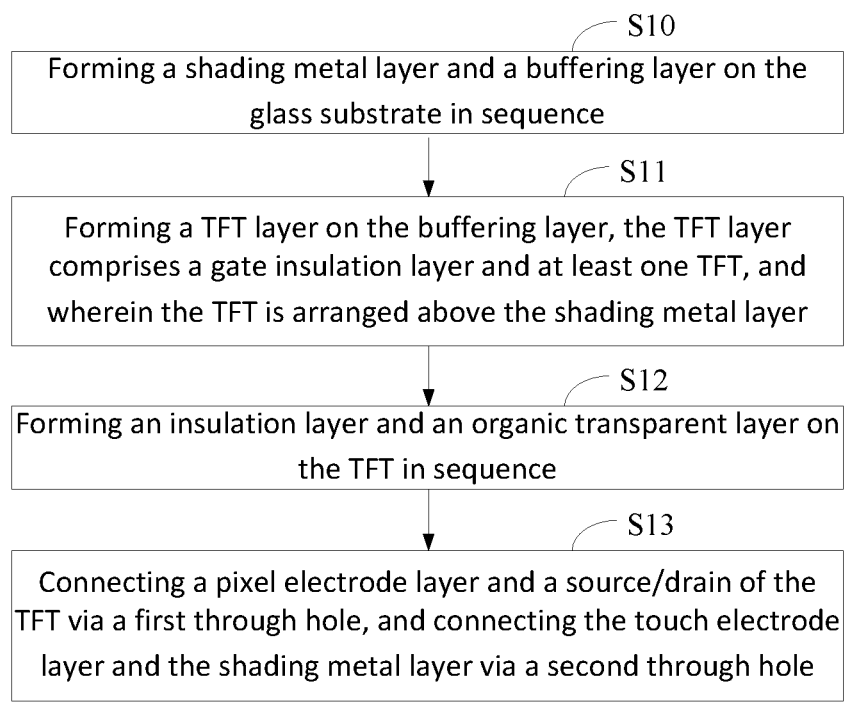
FIG. 9 is a flowchart illustrating the manufacturing method of the array substrate in accordance with the first embodiment.

FIG. 9 is a flowchart illustrating the manufacturing method of the array substrate in accordance with the first embodiment.

In step S10, forming a shading metal layer and a buffering layer on the glass substrate in sequence.

In step S11, forming a TFT layer on the buffering layer, the TFT layer includes a gate insulation layer and at least one TFT, and wherein the TFT is arranged above the shading metal layer.

In step S12, forming an insulation layer and an organic transparent layer on the TFT in sequence.

In step S13, connecting a pixel electrode layer and a source/drain of the TFT via a first through hole, and connecting the touch electrode layer and the shading metal layer via a second through hole.

In the embodiment, the TFT includes a polysilicon layer, a first metal layer, and a second metal layer. In step S11, the polysilicon layer is arranged on the buffering layer. A heavy-doping process is applied to two lateral sides of the polysilicon layer to form heavy-doping areas. Doping areas are arranged at two lateral sides of the polysilicon layer, and a heavy-doping process is adopted to form the heavy-doping area at one side of the doping area facing away the polysilicon layer. The gate insulation layer and the first metal layer are arranged on the polysilicon layer in sequence to form the gate. The second metal layer is formed on the heavy-doping area to form the source/drain, wherein the second metal layer passes through the insulation layer.

In the embodiment, in step S13, the touch electrode layer is arranged on the organic transparent layer. The passivation layer and the pixel electrode layer are arranged on the touch electrode layer in sequence. The first through hole passes through the passivation layer, the touch electrode layer, and the organic transparent layer in sequence. The conductive film forming the pixel electrode layer passes through the passivation layer, the touch electrode layer, and the organic transparent layer, and contacts with the second metal layer passing through the insulation layer above the insulation layer 24. A second through hole passes through the organic transparent layer, the insulation layer, the gate insulation layer, and the buffering layer. The conductive film forming the touch electrode layer passes through the organic transparent layer, the insulation layer, the gate insulation layer in sequence and the buffering layer contacts with the shading metal layer directly. The second through hole may pass through the organic transparent layer and the insulation layer in sequence. The second metal layer connects with the shading metal layer via a third through hole. The conductive film forming the touch electrode layer passes through the organic transparent layer and the insulation layer, and contacts with the second metal layer above the gate insulation layer so as to connect to the shading metal layer. The third through hole passes through the gate insulation layer and the buffering layer.

In the embodiment, the shading metal layer connecting with the touch electrode layer may connect to the shading metal layer right below the TFT. At this moment, the shading metal layer below the TFT extends outward so as to connect with the touch electrode layer. The shading metal layer connecting with the touch electrode layer may be separated from the shading metal layer right below the TFT. The shading metal layer connecting with the touch electrode layer operates as the Rx signal line. The shading metal layer right below the 231 is configured to shadow the light so as to prevent the TFT from the electrical leakage. The conductive film of the touch electrode layer and of the pixel electrode layer are ITO films.

In the embodiment, the through hole between the second metal layer and the shading metal layer 1 may adopt a mask of the insulation layer. After the insulation layer and the gate insulation layer are etched, the buffering layer having a greater etching selection ratio of SiNx to P—Si, such that other portions of the P—Si may not be etched when the second metal layer and the shading metal layer are connected.

The array substrate adopts the shading metal layer to operate as the Rx signal line connecting the touch electrode and the touch chip (IC). With such configuration, additional masking process for manufacturing the third metal layer is not needed. Thus, the through-hole process for connecting the touch electrode and the Rx signals is not needed. In brief, two masking processes may be omitted. In addition, by adopting the shading metal layer to be the Rx signal line connecting the touch electrode and the touch chip (IC), a gap between the touch electrode layer and the Rx signal line is larger. The organic transparent layer, the insulation layer, the gate insulation layer, and the buffering layer are arranged between the touch electrode layer and the Rx signal line. Thus, the capacitance between the touch electrode and the Rx signal line may be configured to be very small, and thus the coupling capacitance between the touch electrode and the Rx signal line may be effectively reduced.

In step S13, a pixel electrode layer is arranged on an organic transparent layer. A passivation layer and a touch electrode layer 36 are arranged on the pixel electrode layer in sequence. As such, a first through hole passes through the organic transparent layer. The conductive film forming the pixel electrode passes through the organic transparent layer and contacts with the second metal layer above an insulation layer, and the second metal layer passes through the insulation layer, the organic transparent layer, the insulation layer, the gate insulation layer and the buffering layer. A second through hole passes through the passivation layer, the organic transparent layer, the insulation layer, the gate insulation layer, and the buffering layer. The conductive film forming the touch electrode passes through the passivation layer, the organic transparent layer, the insulation layer, the gate insulation layer, and the buffering layer in sequence to directly contact with the shading metal layer. The second through hole may pass through the passivation layer, the organic transparent layer, and the insulation layer. The second metal layer may pass through a third through hole to connect to the shading metal layer. The conductive film forming the touch electrode layer passes through the passivation layer, the organic transparent layer, and the insulation layer to contact with the second metal layer above the gate insulation layer, and further to connect to the shading metal layer. The third through hole passes through the gate insulation layer and the buffering layer in sequence.

The organic transparent layer, the insulation layer, the gate insulation layer, and the buffering layer are arranged between the touch electrode layer and the Rx signal line. Thus, the capacitance between the touch electrode and the Rx signal line may be configured to be very small, and thus the coupling capacitance between the touch electrode and the Rx signal line may be effectively reduced.

In the embodiment, after step S12, two insulation layers may be configured to further increase the gap between the Rx signal line and the touch electrode. Thus, the capacitance between the touch electrode and the Rx signal line may be configured to be very small, and thus the coupling capacitance between the touch electrode and the Rx signal line may be effectively reduced.

In addition, in step S11, when the gate insulation layer and the first metal layer are formed on the polysilicon layer in sequence, the first metal layer passes through the gate insulation layer and the buffering layer to connect with the shading metal layer. During the manufacturing process, one additional masking process may be configured to manufacture the through hole passing through the gate insulation layer and the buffering layer. When the gate is manufactured, the first metal layer may be deposited within the through hole at the same time, that is, no additional mask is needed. The configuration of the first metal layer connecting with the shading metal layer may reduce the resistance of the Rx signal line.

In view of the above, the shading metal layer and the buffering layer are formed on the glass substrate in sequence. The TFT layer is formed on the buffering layer, and the TFT is arranged above the shading metal layer. The insulation layer and the organic layer are formed on the TFT layer in sequence. In addition, the pixel electrode layer connects to the source/drain of the TFT via the first through hole. The touch electrode layer connects to the shading metal layer via the second through hole. The passivation layer is configured between the pixel electrode layer and the touch electrode layer. In this way, the manufacturing process is simplified, and the coupling capacitance between the touch electrode and the signal line may be effectively reduced.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An array substrate, comprising:
   a glass substrate;
   a shading metal layer formed on the glass substrate;
   a buffering layer formed on the shading metal layer;
   a TFT layer configured on the buffering layer, the TFT layer comprises a gate insulation layer and at least one TFT on the shading metal layer;
   an insulation layer arranged on the TFT layer;
   an organic transparent layer arranged on the insulation layer;
   a pixel electrode layer connecting to a source/drain of the TFT via a first through hole;
   a touch electrode layer connecting to the shading metal layer via a second through hole; and
   a passivation layer configured between the pixel electrode layer and the touch electrode layer;
   wherein
   the pixel electrode layer is arranged on the organic transparent layer;
   the passivation layer is arranged on the pixel electrode layer;
   the touch electrode layer is arranged on the passivation layer;
   the first through hole passes through the organic transparent layer;
   the second through hole passes through the passivation layer, the organic transparent layer and the insulation layer.

2. The array substrate as claimed in claim 1, wherein the TFT comprises a polysilicon layer, a first metal layer, and a second metal layer, the polysilicon layer is arranged on the buffering layer, two lateral sides of the polysilicon layer are configured with heavy-doping areas, the gate insulation layer is arranged on the polysilicon layer, the first metal layer is arranged on the gate insulation, and a patterning process is applied to the first metal layer to form a gate, and the second metal layer passes through the insulation layer to deposit on the heavy-doping area to form the source/drain.

3. The array substrate as claimed in claim 2, wherein the first metal layer passes through the gate insulation layer and the buffering layer to connect with the shading metal layer.

4. The array substrate as claimed in claim 2, wherein the second metal layer passes through the gate insulation layer and the buffering layer to connect to the shading metal layer, and the touch electrode layer connects to the second metal layer via the second through hole.

5. A manufacturing method of array substrates, comprising:

forming a shading metal layer on the glass substrate;
   forming a buffering layer on the shading metal layer;
   forming a TFT layer on the buffering layer, the TFT layer comprises a gate insulation layer and at least one TFT, and wherein the TFT is arranged above the shading metal layer;
   forming an insulation layer on the TFT;
   forming an organic transparent layer on the insulation layer;
   forming a pixel electrode layer on the organic transparent layer;
   forming a passivation layer on the pixel electrode layer;
   forming a touch electrode layer on the passivation layer; and
   connecting the pixel electrode layer and a source/drain of the TFT via a first through hole, and connecting the touch electrode layer and the shading metal layer via a second through hole.

6. The manufacturing method claimed in claim 5, wherein the TFT comprises a polysilicon layer, a first metal layer, and a second metal layer, the step of forming the TFT layer on the buffering layer further comprises:

forming a polysilicon layer on the buffering layer;
   heavy-doping two lateral sides of the polysilicon layer to form heavy-doping areas;
   forming a gate insulation layer on the polysilicon layer and a first metal layer on the gate insulation layer to form a gate; and
   forming a second metal layer on the heavy-doping areas to form the source/drain.

7. The manufacturing method claimed in claim 5, wherein the step of forming the second metal layer on the heavy-doping area further comprises:

the second metal layer passes through the gate insulation layer and the buffering layer to connect to the shading metal layer, and the touch electrode layer connects to the second metal layer via the second through hole.

8. The manufacturing method claimed in claim 5, wherein the step of forming a gate insulation layer and a first metal layer on the polysilicon layer further comprises:

the first metal layer passes through the gate insulation layer and the buffering layer to connect to the shading metal layer.

* * * * *